United States Patent
Chen et al.

(10) Patent No.: US 9,445,532 B2
(45) Date of Patent: Sep. 13, 2016

(54) INTEGRATED ELECTRICAL AND THERMAL SOLUTION FOR INVERTER DC-LINK CAPACITOR PACKAGING

(71) Applicant: Ford Global Technologies, LLC, Dearborn, MI (US)

(72) Inventors: Lihua Chen, Northville, MI (US); Chingchi Chen, Ann Arbor, MI (US); Shahram Zarei, Farmington Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 311 days.

(21) Appl. No.: 13/891,167

(22) Filed: May 9, 2013

(65) Prior Publication Data

US 2014/0334105 A1 Nov. 13, 2014

(51) Int. Cl.
*H05K 7/20* (2006.01)

(52) U.S. Cl.
CPC .......... *H05K 7/209* (2013.01); *H05K 7/20463* (2013.01); *H05K 7/20509* (2013.01)

(58) Field of Classification Search
CPC .......... H05K 7/20509; H05K 7/2089; H05K 7/20945; H05K 1/0272; H05K 1/0203; H01L 27/00
USPC ............ 361/728, 306.1, 601, 624, 633, 637, 361/639, 648, 676, 688, 702, 713–715, 763, 361/775, 831; 257/707, 719; 363/10, 16, 363/40, 55, 56.01, 123, 141, 159; 29/25, 29/42, 592.1
See application file for complete search history.

(56) References Cited

U.S. PATENT DOCUMENTS

| 4,654,751 A | | 3/1987 | Tokura |
| 4,881,149 A | * | 11/1989 | Tokura ..................... H01G 4/38 361/328 |
| 6,054,818 A | * | 4/2000 | Tabata ................. B60K 7/0007 318/139 |

(Continued)

FOREIGN PATENT DOCUMENTS

JP 2006196680 A * 7/2006

OTHER PUBLICATIONS

Beukes, H.J.; Enslin, J.H.R.; Spee, R.: "Busbar Design Considerations for High Power IGBT Converters", Power Electronics Specialists Conference, 1997, PESC '97 Record, 28th Annual IEEE, Issue date Jun. 22-27, 1997, Print ISBN: 0-7803-3840-5. Source: http://ieeexplore.ieee.org/xpl/freeabs_all.jsp?arnumber=616819.

(Continued)

*Primary Examiner* — Zachary M Pape
*Assistant Examiner* — Amir Jalali
(74) *Attorney, Agent, or Firm* — Maristyn Law LLC; Lynda F. Kouroupis; David B. Kelley

(57) ABSTRACT

An improved capacitor packaging solution is presented that incorporates both thermal and electrical considerations. A package can include capacitor elements electrically coupled to a bus bar, and a thermally enhanced isolation layer between the bus bar and a case. The isolation layer can be provided adjacent a case base and sidewall portions. The bus bar can be disposed adjacent the isolation layer and be configured to extend along the package side and along the package length below the capacitor elements to provide an extended path for heat dissipation from the bus bar prior to its contact with capacitor elements. The enhanced isolation layer is configured to conduct heat away from the bus bar to the case to avoid the hotspot temperature of the capacitor. Reduced capacitor temperature allows use of smaller, cheaper capacitors, reducing inverter costs without compromising performance.

7 Claims, 6 Drawing Sheets

(56) References Cited

U.S. PATENT DOCUMENTS

| | | | | | |
|---|---|---|---|---|---|
| 6,147,869 | A * | 11/2000 | Furnival | ............... | H05K 7/1432 165/185 |
| 6,958,899 | B2 * | 10/2005 | Togashi | ................. | H01G 2/065 361/303 |
| 7,292,451 | B2 * | 11/2007 | Rodriguez | ............ | H02M 7/003 361/775 |
| 7,301,755 | B2 * | 11/2007 | Rodriguez | ........... | H05K 7/1432 165/185 |
| 7,672,138 | B2 * | 3/2010 | Kawabata | ............ | H01M 2/1055 174/520 |
| 7,791,884 | B2 * | 9/2010 | Huang | ............... | H05K 7/20936 165/104.21 |
| 8,112,853 | B2 * | 2/2012 | Yoshinaga | ............ | H01L 25/072 29/25.42 |
| 8,228,660 | B2 * | 7/2012 | Fujii et al. | ................. | 361/274.1 |
| 8,593,817 | B2 * | 11/2013 | Bayerer | ................. | H01L 24/06 174/529 |
| 8,686,601 | B2 * | 4/2014 | Michinaka | ............ | H01L 25/162 307/10.1 |
| 8,837,119 | B2 * | 9/2014 | Kishimoto | ............ | H02M 5/271 307/126 |
| 9,042,101 | B2 * | 5/2015 | Tokuyama | ................... | H01L 23/36 361/704 |
| 9,042,112 | B2 * | 5/2015 | Guan | ................... | H05K 7/1432 361/676 |
| 2004/0060692 | A1 * | 4/2004 | Pfeifer | ................... | H02M 7/003 361/704 |
| 2006/0007720 | A1 * | 1/2006 | Pfeifer | ............... | H05K 7/20927 363/141 |
| 2006/0290689 | A1 * | 12/2006 | Grant | ................... | H02M 7/003 345/204 |
| 2008/0049477 | A1 * | 2/2008 | Fujino | ................... | H02M 7/003 363/131 |
| 2008/0112201 | A1 * | 5/2008 | Yahata | ................... | H02M 7/003 363/131 |
| 2008/0130223 | A1 * | 6/2008 | Nakamura | ............ | H02M 7/003 361/689 |
| 2009/0059467 | A1 * | 3/2009 | Grimm | ................... | H01G 4/224 361/301.5 |
| 2010/0039748 | A1 * | 2/2010 | Fujii | ..................... | H01G 2/08 361/274.1 |
| 2010/0195301 | A1 * | 8/2010 | Fotherby | ............... | H02M 7/003 361/775 |
| 2010/0259898 | A1 * | 10/2010 | Kimura | ................... | H05K 7/209 361/704 |
| 2010/0328893 | A1 * | 12/2010 | Higashidani | ....... | H05K 7/20927 361/702 |
| 2011/0102966 | A1 * | 5/2011 | Takeoka | ................... | H01G 2/08 361/301.3 |
| 2011/0149625 | A1 * | 6/2011 | Azuma | ................... | B60K 6/28 363/141 |
| 2012/0229977 | A1 * | 9/2012 | Hosking | ................... | H01G 4/35 361/688 |
| 2012/0262838 | A1 * | 10/2012 | Otsuka | ................... | H01G 2/06 361/306.1 |
| 2013/0242517 | A1 * | 9/2013 | Fujidai | ............... | H01L 23/49822 361/762 |
| 2014/0233188 | A1 * | 8/2014 | Terasawa | ............... | H05K 7/142 361/719 |
| 2014/0252587 | A1 * | 9/2014 | Kodama | ............. | H05K 7/2049 257/712 |
| 2014/0285969 | A1 * | 9/2014 | Kojima | ................... | H01G 2/14 361/689 |
| 2014/0313806 | A1 * | 10/2014 | Shinohara | ......... | H05K 7/20927 363/141 |
| 2014/0334105 | A1 * | 11/2014 | Chen | ..................... | H05K 7/209 361/714 |

OTHER PUBLICATIONS

Beukes, H.J.; Enslin, J.H.R.; Spee, R.: "Busbar Design Considerations for High Power IGBT Converters", Power Electronics Specialists Conference, 1997, PESC '97 Record, 28$^{th}$ Annual IEEE, Issue date Jun. 22-27, 1997, Print ISBN: 0-7803-3840-5. Source: http://ieeexplore.ieee.org/xpl/freeabs_all.jsp?arnumber=616819 Relevant portion: Abstract.

* cited by examiner

INTEGRATED ELECTRICAL AND THERMAL SOLUTION FOR INVERTER DC-LINK CAPACITOR PACKAGING

BACKGROUND OF INVENTION

1. Field of Invention

This invention relates generally to dc-link capacitors for inverter power modules, and more particularly to capacitor packaging features for electrical and thermal performance.

2. Background Art

Traction inverters for electric and hybrid electric vehicles typically include one or more high performance inverter circuits coupled to a power source via a passive electric device, such as a capacitor or capacitor bank that can store and release energy. The capacitor can smooth dc-link voltage, absorb ripple current, decouple power source inductance effects, and reduce the leakage inductance of the inverter power stage. To minimize parasitic or leakage inductance and optimize performance, a linking capacitor is typically positioned as close as possible to the semiconductor power switches of an inverter, with the size and design of the capacitor often driven by the size and power characteristics of the inverter to which it is linked. Inverter operation can generate heat that can be partially transferred to the link capacitor. Unfortunately, capacitor package thermal conductivity is generally rather poor, typically less than 1 W/m·K. Thus, even a small amount of heat transferred to the capacitor can significantly raise its temperature. Power module internal temperatures can reach 150° C., but most linking capacitors can only tolerate temperatures at or below 105° C. Consequently, capacitor temperature typically becomes an operational design constraint. As a result, inverter link capacitors are typically exaggerated in size to withstand the thermal challenges imposed by the inverter, and, as a consequence, increase the cost, size and weight of the inverter system.

FIG. 1A shows a traditional prior art inverter dc-link capacitor package 102 electrically coupled to an inverter power module 104. The package 102 is characterized by a length L, a height H and a width W. The traditional capacitor package 102 includes a resin layer 106 in which capacitor elements 108 are disposed, and a case 110 that can provide support for the package 102. A bus bar 112 has an internal portion 114 extending above and coupled to the elements 108. The bus bar 112 also includes an external portion 116 that extends externally to connect with the inverter power module 104. Heat transferred to the bus bar external portion 116 can, to a limited extent, radiate to the external environment; however, much of the heat is conducted to the internal portion 114. Due to the poor thermal characteristics of the package 102, the transferred heat can substantially raise the temperature of the capacitor elements 108. Unfortunately, high temperatures can cause a capacitor to breakdown at a lower voltage level. High temperatures can also adversely affect a capacitor's electrical performance and shorten its lifetime.

FIG. 1B shows an example equivalent circuit 120 for the traditional dc link capacitor package 102 that includes a series of thermal resistances R1-R5 between an IGBT terminal and a case/coolant. Based on the circuit 120, EQ. (1) below provides an expression for the maximum temperature of the traditional dc-link capacitor of the package 102:

$$T_{max}(C_{trad}) = T_{coolant} + (R3+R4+R5)*(R1+R2+R3+R4+R5)*(T_{PM}-T_{coolant}) \quad \text{(EQ. 1)}$$

Where:
$T_{coolant}$=coolant temperature
$T_{PM}$=power module temperature
R1=thermal resistance of bus bar external portion 116 from IGBT terminal to dc-link capacitor internal bus bar portion 114;
R2=thermal resistance of resin from capacitor internal bus bar 114 to capacitor element 108;
R3=6.6 C/W, thermal resistance of capacitor element 108, from top to bottom;
R4=thermal resistance of epoxy 106 from capacitor element 108 bottom to case 110
R5=thermal resistance of capacitor case 110 to coolant if direct cooling, or to air if convection cooling Example values for the variables listed above are provided below:
L=210 mm
W=160 MM
H=33 mm,
R1=0.54 C/W
R2=0.1 C/W
R3=6.6 C/W
R4=0.1 C/W
R5=0.4 C/W Substituting the above values into EQ. 1 results in the simplified EQ. 2 below:

$$T_{max}(C_{trad}) = T_{coolant} + 0.92*(T_{PM}-T_{coolant}) \quad \text{(EQ. 2)}$$

As shown by EQ. 2, the maximum temperature experienced by the example traditional capacitor can be over 90% of the temperature differential between the power module and the case, indicating that much of the heat produced at the power module can be transferred to the traditional linking capacitor. From EQS. (1) and (2) it can be seen that the traditional capacitor package offers a capacitor little protection against temperature increases caused by power module operation. The use of an inverter cooling plate with circulating coolant can reduce the temperature at the traditional capacitor. Nevertheless, because the thermal conductivity of the traditional capacitor package is fairly low, typically less than 1 W/m·K, it is difficult for the capacitor to radiate or dissipate heat, whether the heat is generated within the package by ripple currents, or transferred from an external power module. Even a few watts of heat can make a capacitor temperature rise dramatically. Experimental results indicate that in some circumstances a capacitor temperature can increase by 50° C. or more. Unfortunately, such temperature increases can have a significantly detrimental effect on capacitor longevity; every 10° C. temperature increase can be expected to shorten the capacitor lifetime by around 50%. In addition, some systems couple a plurality of inverters to a power source by the same linking capacitor, exposing the capacitor to heat generated by multiple inverter sources. As a result, to assure that a capacitor can tolerate high temperatures, traditional inverter designs often include capacitors sized much larger than electrical requirements alone would demand. Unfortunately, oversized capacitors increase the size and cost of an inverter power module.

OVERVIEW OF INVENTION

An example system includes an inverter power module coupled to a capacitor package configured to dissipate heat from a bus bar through a thermally enhanced isolation layer to a case. In an example embodiment, the case can include a base and a sidewall, and the isolation layer can be disposed adjacent the case. The bus bar can be disposed adjacent the isolation layer. In an example embodiment, the isolation layer is disposed between and adjacent the bus bar and the base, and between and adjacent the bus bar and the sidewall. By way of example, but not limitation, the case can comprise a case for the inverter power module or a dedicated cooling plate with circulating coolant that can further reduce capacitor temperature.

In an example embodiment, a capacitor package can include at least one capacitor element electrically coupled to a bus bar, a case, and an isolation layer disposed between and adjacent the bus bar and the case. In an example embodiment, the isolation layer can be disposed between the bus bar and a case base, and between the bus bar and a case sidewall. Because the isolation layer is adjacent to both the bus bar and the case, it can transfer heat away from the bus bar to the case, protecting capacitor elements against the high increases in temperature often experienced by prior art linking capacitors. The lower capacitor temperatures enable it to tolerate higher voltages. Because the package offers improved thermal performance, power module assemblies can employ smaller, more economical linking capacitors. In an exemplary embodiment, a bus bar and adjacent isolation layer can extend through the depth of a capacitor package and across its length to provide a longer thermal path for heat dissipation away from the bus bar prior to its contact with a capacitor element.

DETAILED DESCRIPTION OF EXAMPLE EMBODIMENTS

Example embodiments of the invention are presented herein; however, the invention may be embodied in a variety of alternative forms, as will be apparent to those skilled in the art. To facilitate understanding of the invention, and provide a basis for the claims, various figures are included in the description. The figures may not be drawn to scale and related elements may be omitted so as to emphasize the novel features of the invention. Structural and functional details depicted in the figures are provided for the purpose of teaching the practice of the invention to those skilled in the art and are not to be interpreted as limitations.

Figure 2A:
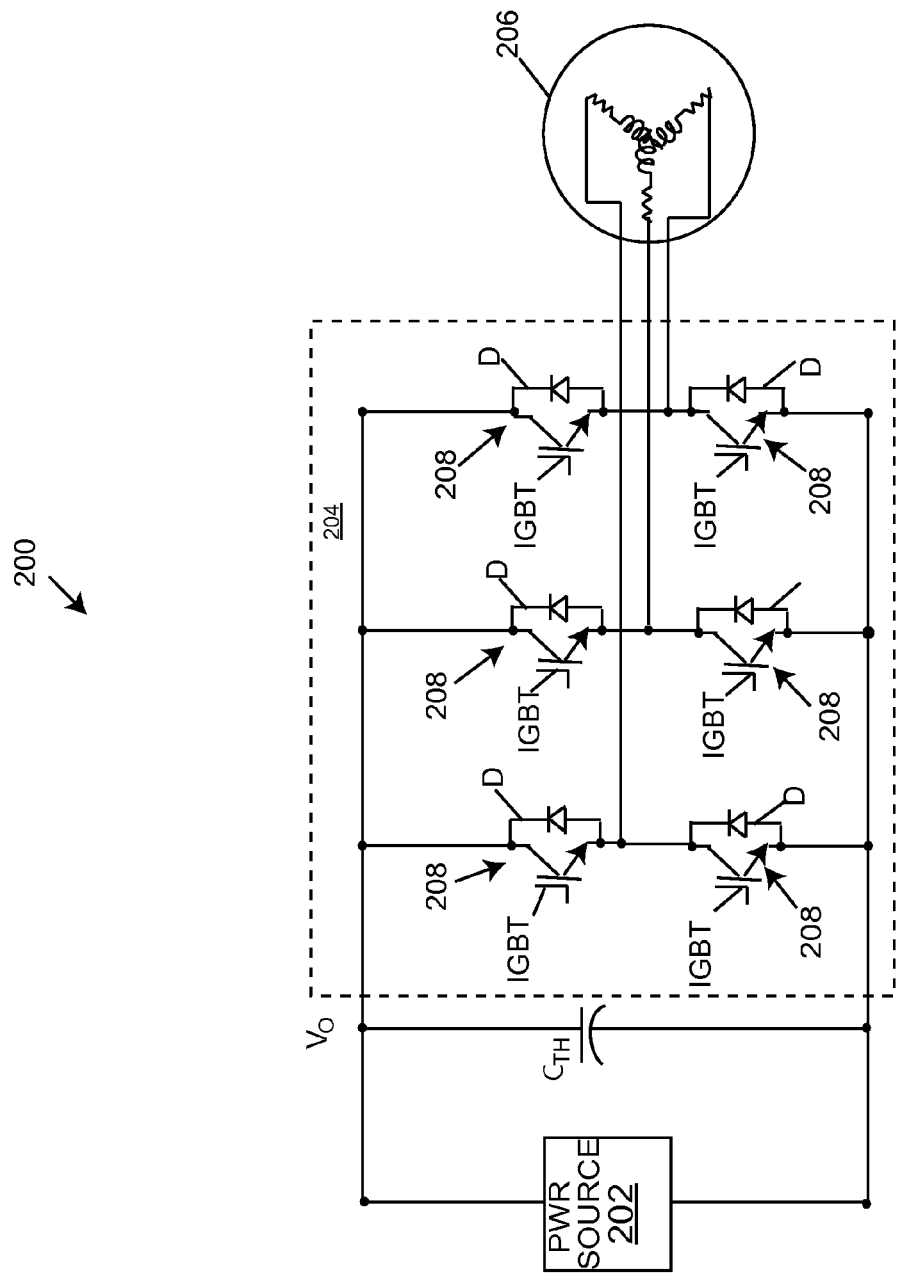
FIG. 2A shows a circuit of an example system of the invention.

FIG. 2A shows a circuit diagram of an example system 200 of the invention. By way of example, but not limitation, the system 200 can be employed in an electric drive system of an electric or hybrid electric vehicle. A power source 202 can be coupled to an inverter 204 to drive a load 206, which, in the context of an electric vehicle, can be an electric motor. By way of example, the power source 202 can comprise a high voltage battery coupled to a voltage converter. In an example embodiment, the inverter 204 can comprise six switching units 208, each comprising a transistor, such as an insulated gate bipolar transistor (IGBT), in antiparallel with a diode D, configured to provide alternating current to the load 206. Between the power source 202 and the inverter 204, a linking capacitor in a package with improved thermal characteristics, $C_{TH}$, can be disposed. The linking capacitor $C_{TH}$ can be configured to absorb ripple currents generated at the inverter 204 or the power source 202 and stabilize the dc-link voltage Vo for inverter control. The capacitor $C_{TH}$ can be provided in a package that improves heat dissipation while simultaneously improving electrical performance.

Figure 2B:
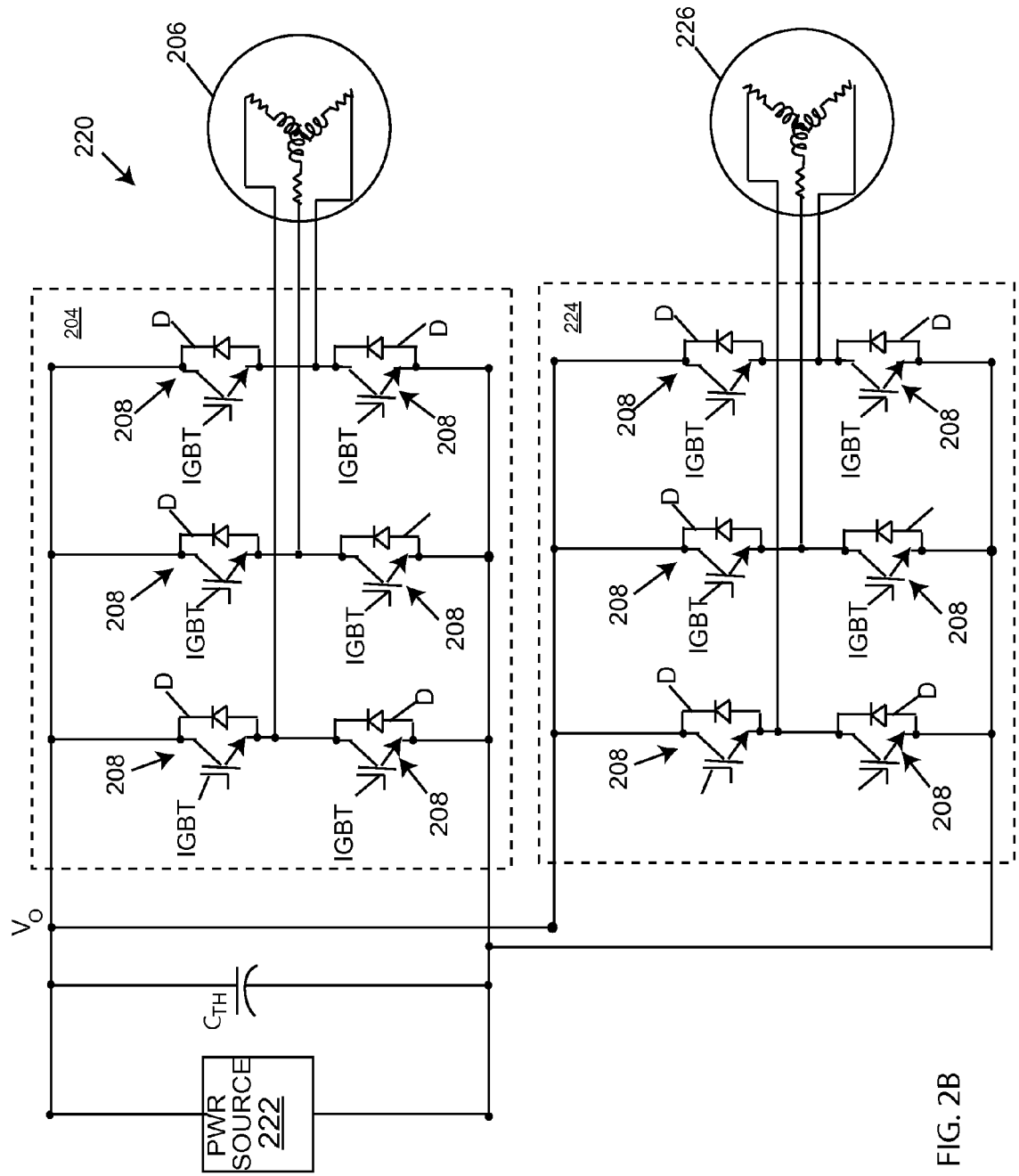
FIG. 2B shows a circuit of an example system of the invention.

In many cases, a linking capacitor can be configured to couple a plurality of inverters to a power source. FIG. 2B depicts a circuit diagram for a system 220 having a power source 222, and a plurality of inverters, represented here by the inverter 204 and an additional inverter 224, coupled to a plurality of loads, represented here by loads 206, 226 respectively. While FIG. 2B shows only two inverters and two loads, it is understood that a multi-inverter system can include more than 2 inverters. It is further noted that a linking capacitor coupled to one or more inverters can comprise a capacitor bank having a plurality of capacitor elements arranged parallel with each other. A linking capacitor $C_{TH}$ in a thermally enhanced package can be disposed to link the power source 222 with the inverters 204, 224, each of which can comprise a plurality of semiconductor switching units 208 that can be individually driven to provide an alternating current to the loads 206, 226. To reduce parasitic and leakage inductances in the circuit, it is helpful to position the linking capacitor $C_{TH}$ as close as possible to the semiconductor switching units 208. However, that proximity can subject the linking capacitor $C_{TH}$ to heat generated at the inverters 204, 224. The linking capacitor $C_{TH}$ is packaged and configured to effectively dissipate heat while stabilizing Vo voltage. Its improved thermal properties lower the maximum temperature that it experiences and improve its reliability. Accordingly, it can be sized smaller than traditional linking capacitors, and can thereby reduce the size and cost of inverter power modules.

Figure 3:
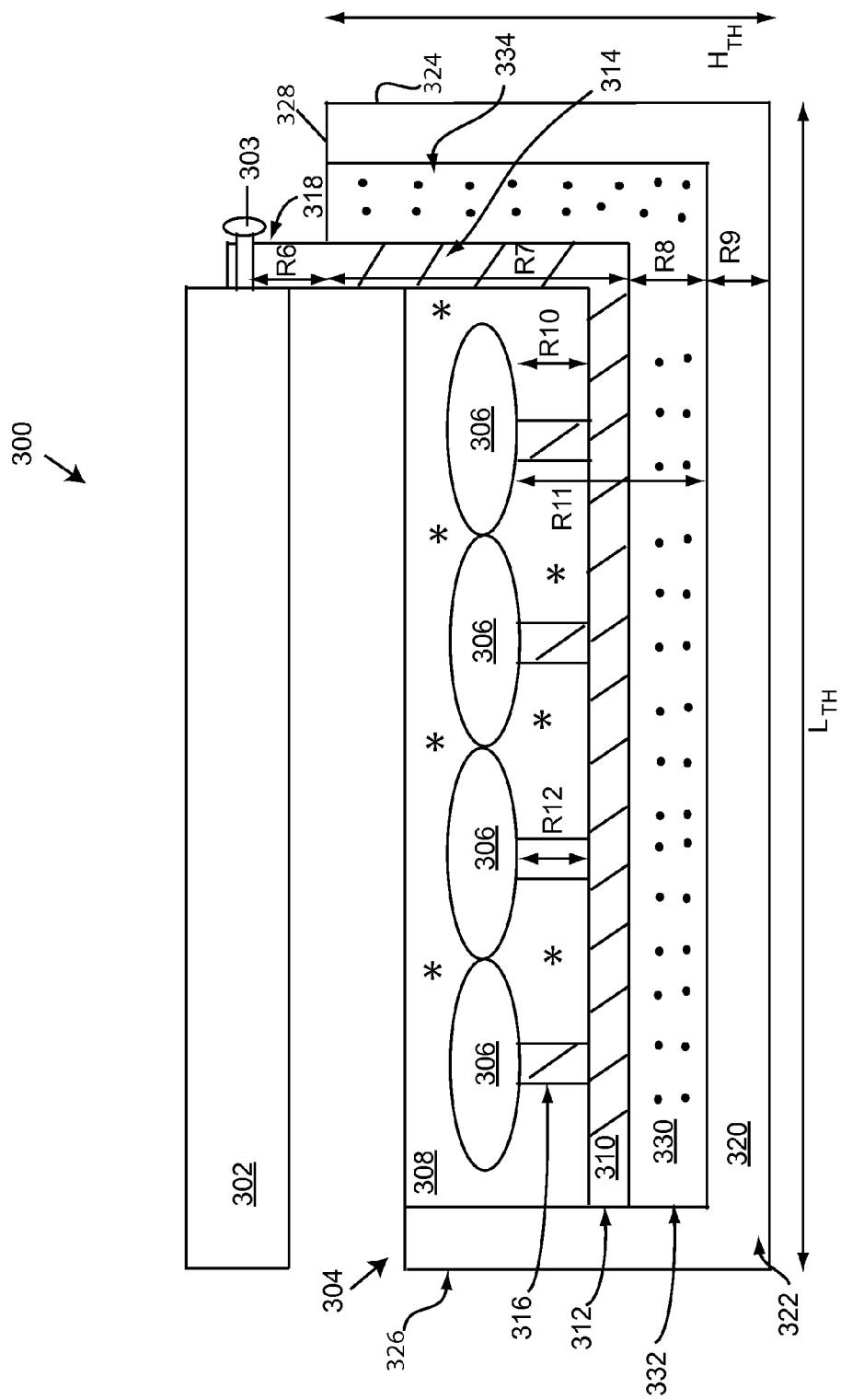
FIG. 3 shows a front sectional view of an example enhanced capacitor package of the invention.
Figure 4:
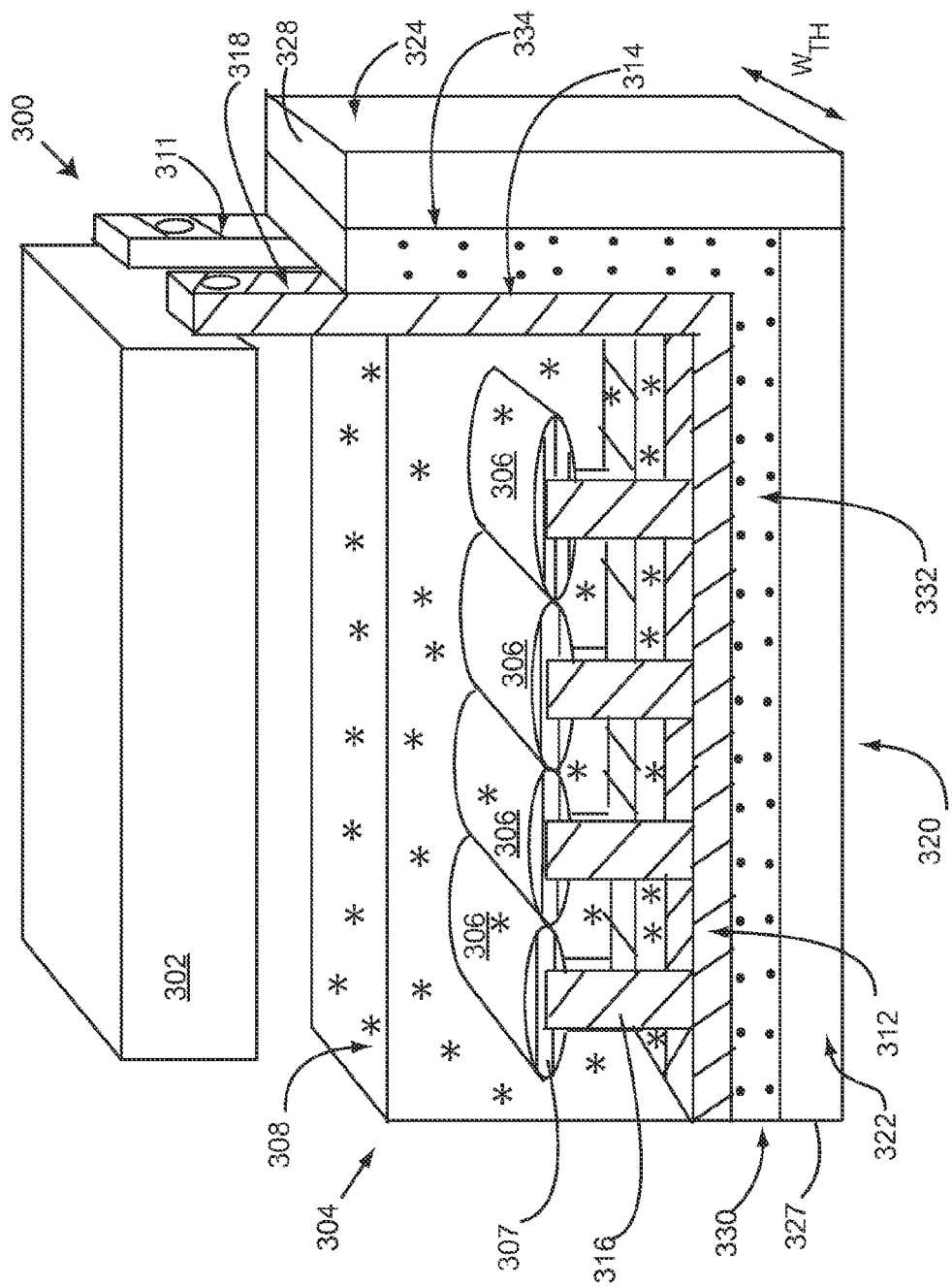
FIG. 4 shows a front perspective view of an example enhanced capacitor package of the invention.

FIGS. 3 and 4 show an example embodiment 300 that includes an inverter power module 302 coupled to an enhanced capacitor package 304 having improved thermal properties. FIG. 3 depicts a front sectional view, and FIG. 4 depicts a front perspective view. The inverter power module 302 can include one or more inverters as discussed above in reference to the system depicted in FIG. 2B, and can be configured for electrical connection with the capacitor package 304. By way of example, the package 304 can be electrically coupled to the inverter module 302 by one or more screws 303.

The enhanced capacitor package 304 can include one or more capacitor elements 306, a bus bar 310 configured to couple the elements 306 to each other and to the inverter power module 302, and a case 320. An isolation layer 330 can be disposed between the bus bar 310 and the case 320 to transfer heat away from the bus bar 310 and to the case 320 to reduce temperature increases at the capacitor elements 306. In an example embodiment, the bus bar 310 and the isolation layer 330 can be configured to extend along the height/depth dimension of the package 304 having a height $H_{TH}$, and along a package linear/length dimension having a length $L_{TH}$, to provide more surface area for heat transfer than that typically provided by traditional capacitor packages.

The capacitor elements 306 can be disposed in a resin layer 308. In an example embodiment, the capacitor elements 306 can comprise rolled polypropylene film having sprayed metallic electrodes 307 on opposing faces. In an example embodiment, the elements 306 can be positioned laterally within the package 304 as shown in FIGS. 3 and 4. Accordingly, the elements 306 can have a horizontal orientation within the package 304. The resin layer 308 can comprise an electrically non-conductive epoxy resin that can support and mold the capacitor elements 306 in the package 304. In an example embodiment, the resin layer 308 can also be configured with thermally enhanced characteristics. An electrically conductive bus bar 310 can electrically couple the capacitor elements 306 with each other and with the power module 302.

The case 320 can include a base 322, and a sidewall 324. In an example embodiment, the base 322 can be configured to extend from the sidewall 324, to a second opposing sidewall 326; and the case sidewall 324 can be configured to extend from the base 322 to a top opposing end 328. In an example embodiment, the case 320 can comprise a metallic substance configured to provide support as well as conduct heat away from the package 304 interior. For example, the case 320 can comprise aluminum, which provides the further advantage of resistance to humidity. In an exemplary embodiment, some part or all of the case 320 can comprise a cooling plate that can be equipped with a circulating coolant to function as a heat sink for the inverter power module 302.

The isolation layer 330 can provide electrical isolation between the bus bar 310 and the case 320, as well as provide a heat conducting medium that can improve the transfer of heat from the bus bar 310 to the case 320, and thus reduce the amount of heat transferred to the capacitor elements 306. In an exemplary embodiment, the isolation layer 330 comprises a thermally enhanced substance configured to improve heat dissipation. By way of example, the isolation layer 330 can comprise an epoxy substance in which a thermally conductive filler, such as, but not limited to, alumina filler, has been infused. The filler particles can have a spherical shape to further enhance thermal conductivity. In an example embodiment, the thermally enhanced isolation layer 330 can have a thermal resistance as low as 0.1 C/W, even with the increased distance between the capacitor elements 306 and the case 320.

In an example embodiment, the isolation layer 330 can have a base portion 332 disposed adjacent the base 322, and a sidewall portion 334 disposed adjacent the sidewall 324. By way of example, but not limitation, the isolation layer base portion 332 can be disposed adjacent the entire length $L_{TH}$ of the base 322 between the two sidewalls 324 and 326. In an example embodiment, the isolation layer sidewall portion 334 can be disposed adjacent the entire height $H_{TH}$ of the package 304 between the base 322 and the opposing end 328.

Figure 1A:
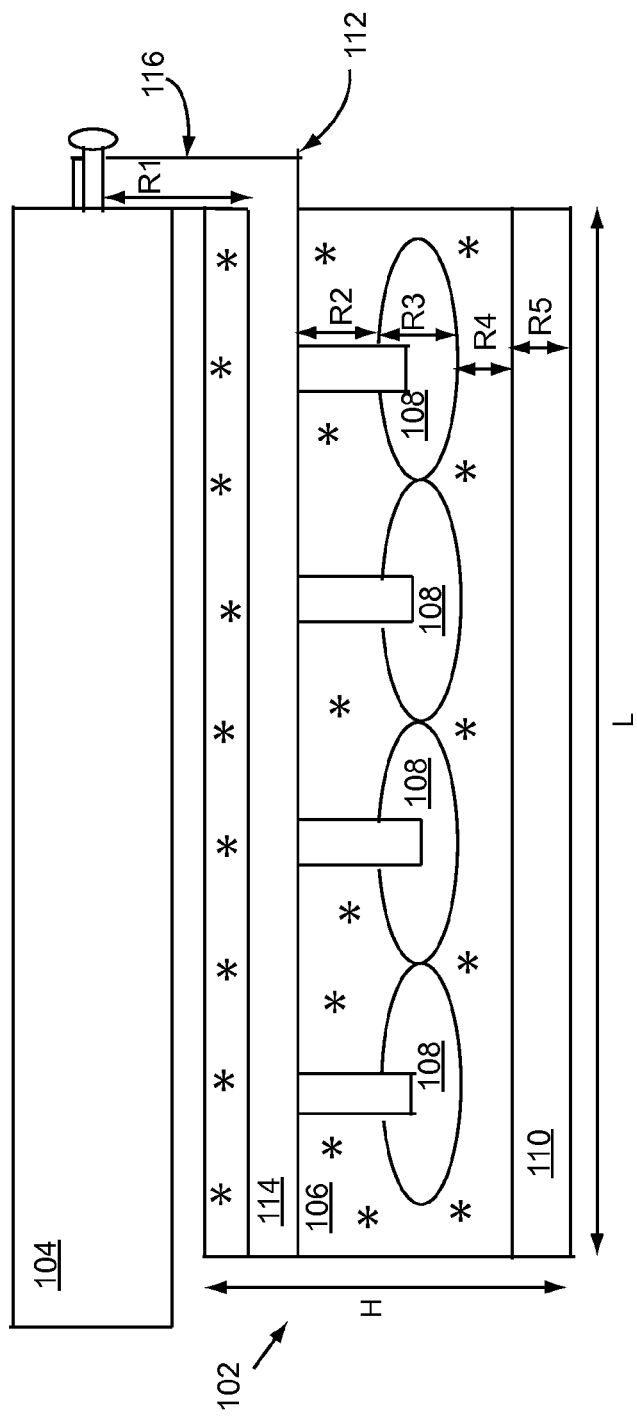
FIG. 1A shows a comparative example of a traditional linking capacitor.
Figure 1B:
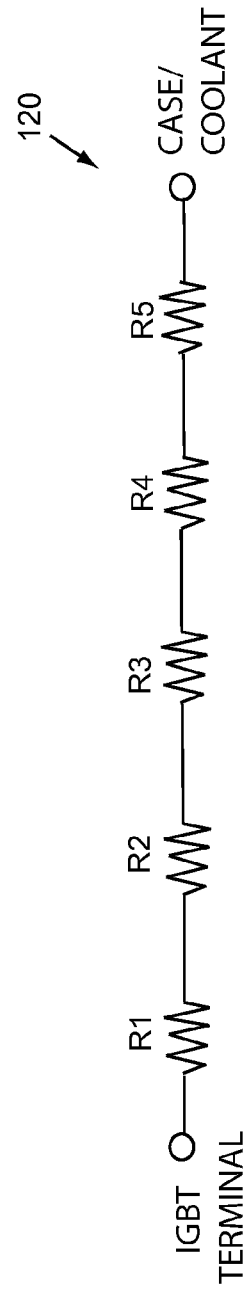
FIG. 1B shows an equivalent circuit for the traditional linking capacitor of FIG. 1A.

The bus bar 310 can have a base portion 312 configured to extend adjacent the isolation layer base portion 332, and can have a sidewall portion 314 configured to extend adjacent the isolation layer sidewall portion 334. In an example embodiment, the bus bar base portion 312 can be configured to extend across the package length $L_{TH}$ adjacent said isolation layer base portion 332 from said isolation layer sidewall portion 334 to the second sidewall 326. Similarly, by way of example, the bus bar sidewall portion 314 can be configured to extend adjacent the isolation layer sidewall portion 334 from the isolation layer base portion 332 to the opposing end 328 to maximally extend along the dimension $H_{TH}$. By way of example, but not limitation, the bus bar 310 can comprise a conductive material such as a copper plate. Thus, in an example embodiment, a bus bar can be configured to extend through the depth of a capacitor and across its length. An isolation layer can be configured to be continuously adjacent the bus bar 310 as it traverses both the sidewall 324 and the base 322. Providing a bus bar 310 and an isolation layer 330 that extend along both the sidewall 324 and the base 322 of the package 304 provides a longer thermal path for heat dissipation to the case 320, and allows a greater amount of heat to transferred away from the bus bar 310 prior to its contact with the capacitor elements 306 than that of traditional capacitor packages, such as the one shown in FIG. 1A.

In an example embodiment, one or more contact extensions 316 can extend up from the bus bar base portion 312 through the resin layer 308 to contact the electrodes 307 on the faces of the capacitor elements 306. In an example embodiment, the bus bar sidewall portion 314 can include a terminal subportion 318 configured to extend beyond the isolation layer sidewall portion 334 and the sidewall 324 for electrical connection with the inverter power module 302. By way of example, but not limitation, as shown in FIGS. 3 and 4 the bus bar sidewall portion 314, the isolation layer sidewall portion 334, and the case sidewall 324 can extend above the resin layer 308. Accordingly, even while the bus bar 310 is continuously adjacent the isolation layer 330, it may not always be adjacent the resin layer 308. In an example embodiment, the capacitor elements 306 disposed in the resin layer 308, the bus bar 310 and the isolation layer 330 can be molded together with the case 320. However alternative embodiments are also contemplated, such as, but not limited to, one in which a coupling means, such as screws or bolts is employed.

FIG. 3 shows a cross-sectional view of the capacitor package 304 in which only one bus bar 310 can be seen. However, as shown in FIG. 4, a second bus bar 311 configured to couple with electrodes on an opposing face of the elements 306 can also be included. In an example embodiment, the isolation layer 330 can provide electrical isolation and heat transfer between the second bus bar 311 and the case 320. However, it is contemplated that alternate arrangements can be configured to achieve the same purposes, for example, a separate isolation layer can be disposed between the case 320 and the second bus bar 311, or the bus bar 311 and bus bar 318 can be laminated as one piece in order to reduce stray inductance.

Figure 5:
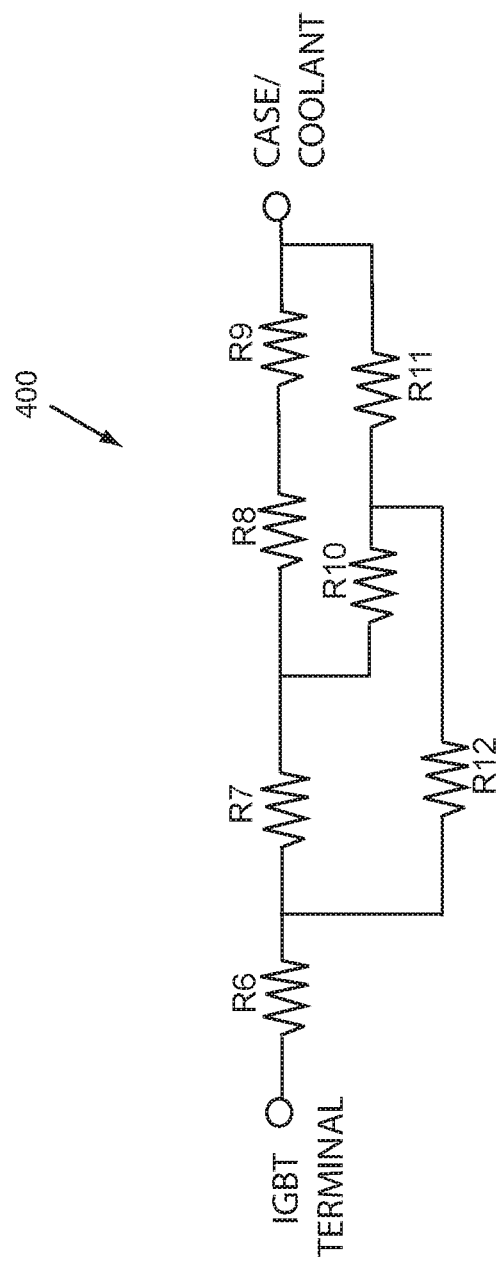
FIG. 5 shows an equivalent circuit for an example enhanced capacitor package of the invention

FIG. 5 depicts an equivalent circuit 400 for the thermally enhanced capacitor package 304. Based on the circuit 400, and using the values listed below, mathematics software Matlab® has been used to provide EQ. (3) as an expression for the maximum temperature at a capacitor element in a thermally enhanced package of the invention.

$$T_{max}(C_{TH}) = T_{case} + 0.24(T_{PM} - T_{case}) \quad (EQ. 3)$$

where:
$L_{TH}$=210 mm; (capacitor package length)
$W_{TH}$=160 mm; (capacitor package width)
$H_{TH}$=33 mm; (capacitor package height)
$T_{case}$=capacitor case temperature;
$T_{PM}$=power module temperature
And the following values were used for thermal resistances:
R6=0.54 C/W, thermal resistance of bus bar terminal subportion 318;
R7=1.5 C/W, thermal resistance of bus bar sidewall portion 314;
R8=0.1 C/W, thermal resistance of isolation layer 330;
R9=0.4 C/W, the thermal resistance of case 320;
R10=0.2 C/W, thermal resistance of resin layer 308;

R11=3.3 C/W, average capacitor element 306 thermal resistance to package case 320;

R12=2.7 C/W, thermal resistance from busbar 310 to cap elements 306

Referring to EQ. (3), which represents the maximum temperature of a linking capacitor of the thermally enhanced capacitor package, the maximum temperature experienced at the capacitor elements 306 is considerably lower than that experienced by elements of a traditional linking capacitor, represented by EQ. (2). The present invention significantly increases the amount of heat transferred away from a package interior to a case, thereby lowering the maximum temperature that a capacitor must tolerate. As shown by EQS. (2) and (3), the amount of heat dissipated by the enhanced capacitor package 304 is about three times that dissipated by a traditional capacitor package. For a thermally enhanced capacitor package, the increase in temperature caused by a power module amounts to about 25% of the temperature difference between a power module and a case. The temperature increase for the traditional package amounts to about 90% of the temperature difference between an power module and a case. Thus the present invention significantly mitigates temperature increases caused by power module operation.

The present invention provides an improved capacitor package in which both thermal and electrical characteristics are considered and improved. The package is configured to increase the amount of heat transferred away from a package interior to a case, and thereby mitigate increases in temperature caused by internal or external sources. Hotspot temperatures can be avoided. Higher voltages can be tolerated. Smaller capacitors can be used as linking capacitors, avoiding the need to deliberately over-size in order to tolerate large temperature increases.

A case for a thermally enhanced package can include a base and a sidewall, either or both of which can comprise an inverter cooling plate. A thermally enhanced isolation layer can be disposed along the case base and sidewall to provide electrical isolation and heat dissipation between a bus bar and the case. A bus bar can be configured with a sidewall portion disposed adjacent the isolation layer through the height/depth of a package, and a base portion disposed adjacent the isolation layer along the length of the enhanced package to provide an extended thermal path for transferring heat away from a bus bar, thereby reducing the amount of heat transferred to a capacitor element, and reducing temperature increases at the package.

The thermally enhanced capacitor package enables the use of smaller, less expensive capacitors, reducing the overall cost of an inverter system without compromising electrical performance. In addition, reducing capacitor temperature improves capacitor reliability and longevity, reducing operational costs associated with inverter systems. The thermally enhanced capacitor package allows a dc-link capacitor to be directly molded with an inverter cooling plate or case, thereby reducing the number of components required, which in turn can simplify or shorten the manufacturing process, increase yield, and reduce manufacturing costs.

The enhanced capacitor package is particularly well-suited for HEV/EV traction inverter applications because vehicle acceleration can cause an inverter to intermittently generate a large amount of heat that is transferred to a linking capacitor. The improved package of the invention can protect a capacitor from adverse heat effects by conducting heat away from a bus bar prior to its contact with capacitor elements, and preventing accumulation of heat in the capacitor. As a result, capacitor design specifications can be determined based on average vehicle performance rather than acceleration or high performance operational modes in which inverter-generated heat must be considered.

The improved thermal properties of a capacitor package of the invention also protect a capacitor against heat generated by sources other than an inverter power module. For example, internal ripple currents within a capacitor can generate heat, as well as external environmental conditions. When a vehicle is parked in a sunny, hot location for an extended period of time, for example an hour or longer, a dc-link capacitor temperature can reach 95° C. or higher. The enhanced package of the invention can dissipate heat more quickly than traditional packages, thereby reducing the capacitor temperature so that maximum inverter and electric drive performance can be more readily achieved.

Although the invention has been described with reference to non-limiting example embodiments illustrated in the attached drawings, it is noted that equivalents may be employed and substitutions made herein without departing from the scope of the invention as recited in the appended claims.

What is claimed:

1. A system, comprising:
   an inverter module;
   a capacitor package coupled to the inverter module;
   wherein the capacitor package includes a case that has a base and a sidewall;
   wherein the capacitor package includes a bus bar having a base portion configured to extend parallel to a length dimension of said base and a sidewall portion configured to extend parallel to a height dimension of said sidewall;
   wherein the capacitor package includes at least one capacitor element disposed laterally within a resin layer, above and separated from said bus bar base portion;
   wherein a contact extension is configured to extend vertically through said resin layer to couple said bus bar base portion to an electrode at said capacitor element; and
   wherein the capacitor package includes a thermally enhanced isolation layer disposed between and adjacent the bus bar and the case for the extent of said bus bar within the case.

2. The system of claim 1, wherein said bus bar base portion is disposed below said capacitor element, adjacent and between the isolation layer and the resin layer.

3. The system of claim 1, wherein the isolation layer is disposed adjacent the entire height of said sidewall.

4. The system of claim 3, wherein the isolation layer is disposed between the base and the base portion of said bus bar and between the sidewall and a sidewall portion of the bus bar.

5. The system of claim 1, wherein said case comprises a cooling plate for said inverter module.

6. The system of claim 1, wherein said isolation layer comprises a thermally enhanced isolation layer configured to improve heat dissipation from the package interior to the case.

7. The system of claim 1, wherein said lateral disposition of said capacitor element causes said electrode to face neither said base nor said sidewall.

* * * * *